United States Patent [19]
Pitot et al.

[11] Patent Number: 5,719,577
[45] Date of Patent: Feb. 17, 1998

[54] LOW-COST INTEGRABLE DEVICE FOR THE ACQUISITION OF ELECTRIC SIGNALS IN COMPLIANCE WITH THE ARNIC 429 STANDARD

[75] Inventors: Christian Pitot, Boulogne; Louis Vriz, Villebon sur Yvette, both of France

[73] Assignee: Sextant Avionique, Velizy Villacoublay, France

[21] Appl. No.: 619,083

[22] Filed: Mar. 21, 1996

[30] Foreign Application Priority Data

Mar. 27, 1995 [FR] France .................. 95 03659

[51] Int. Cl.$^6$ .................................................. H03M 1/12
[52] U.S. Cl. .................................................. 341/157
[58] Field of Search .................. 341/157, 158, 341/155, 162, 164, 165

[56] References Cited

U.S. PATENT DOCUMENTS 4,298,959  11/1981  Sundermeyer et al.

OTHER PUBLICATIONS

B. Hallgren, Possible Applications of the Sigma Delta Digitizer in Particle Physics, Nuclear Instruments & Methods in Physics Research A, vol. A307, No. 2/03, pp. 436–447, Oct. 1, 1991.

*Primary Examiner*—Brian K. Young
*Attorney, Agent, or Firm*—Browdy and Neimark

[57] ABSTRACT

In order to convert an analog signal of digital data transmission into a digital signal, the device embodying the invention comprises a passive analog circuit comprising a capacitor charged by the analog signal via a first resistor, the voltage at the terminals of the capacitor being applied via a second resistor, at the input of a digital circuit comprising a threshold comparator applying, to a flip-flop, a logic signal which is a function of the result of the comparison with a threshold of the voltage at the input, a means for periodically applying at the input a charge or discharge pulse so as to bring the voltage at the input back to the threshold voltage, a counting circuit for periodically determining a number representative of the analog signal, obtained from subtracting the number of discharges from the number of charges.

13 Claims, 3 Drawing Sheets

Fig.1
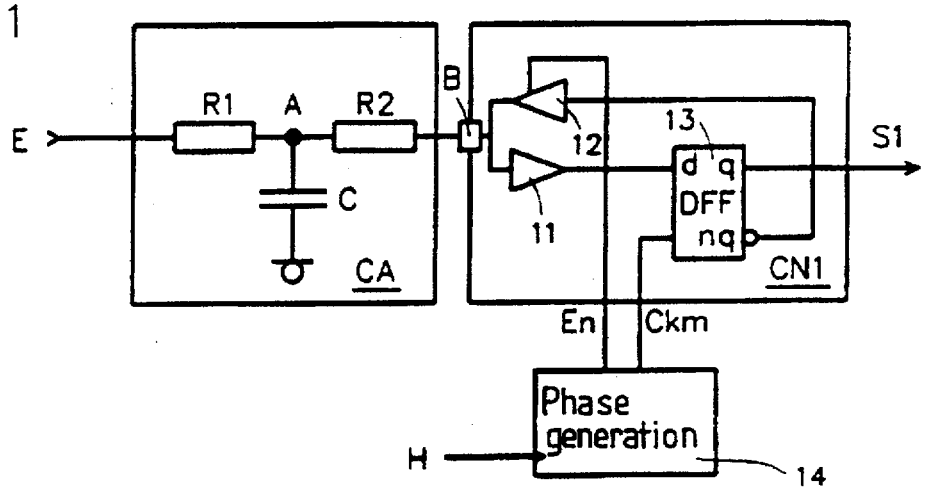
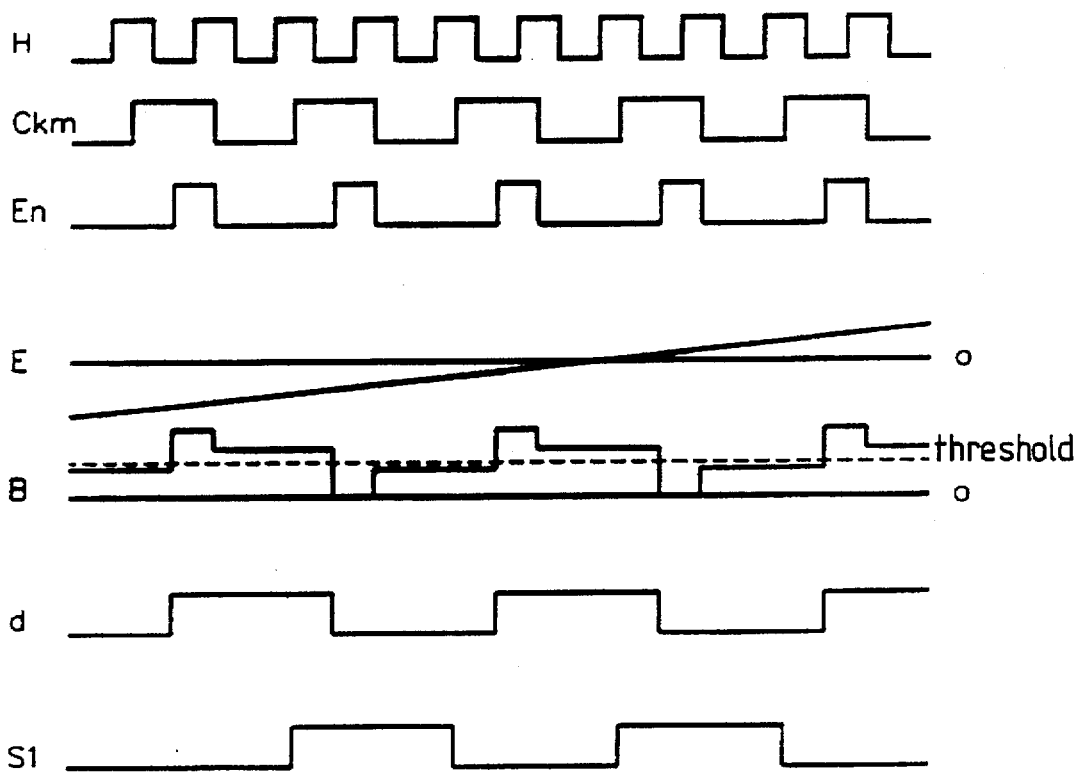
Fig.2

Fig. 3
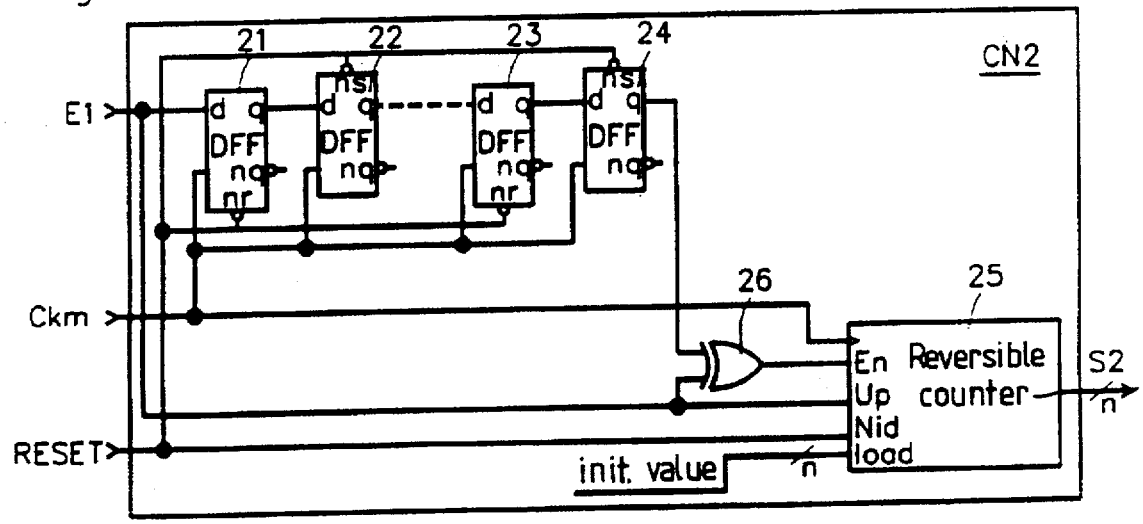
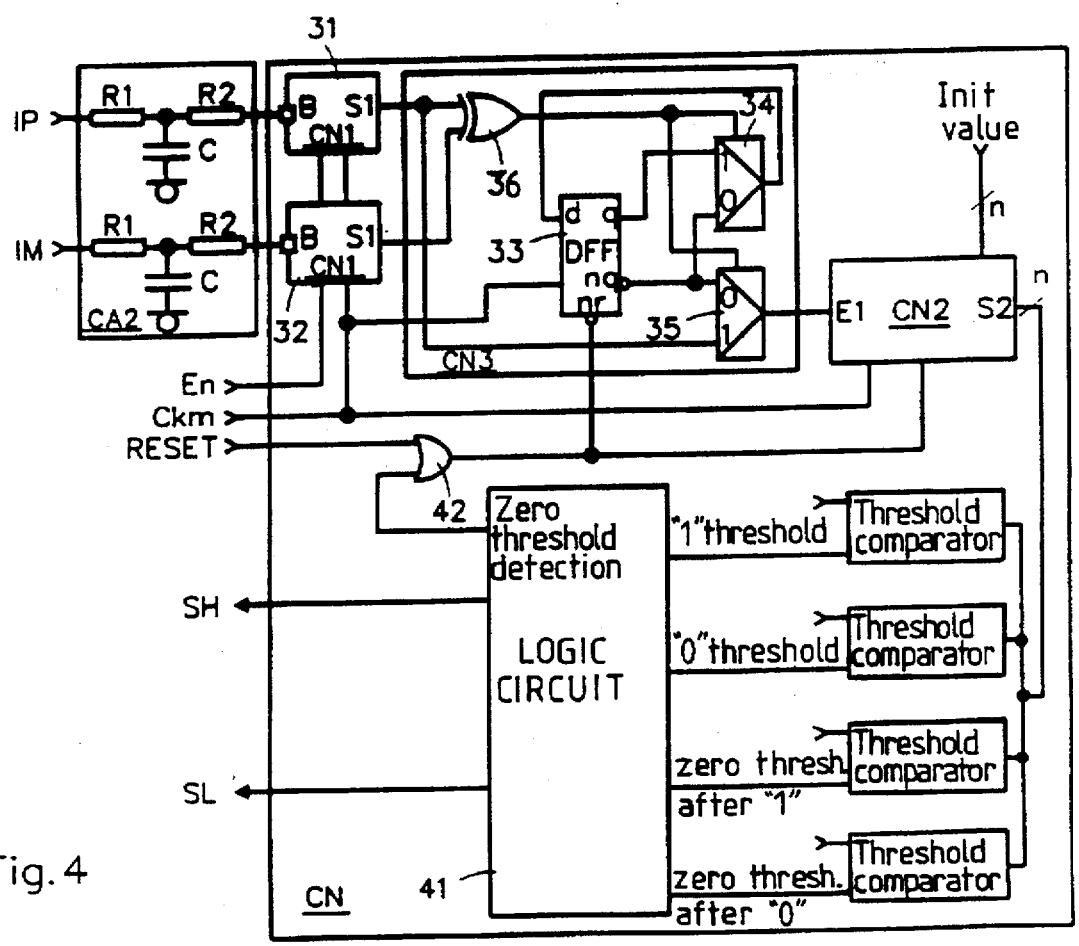
Fig. 4

LOW-COST INTEGRABLE DEVICE FOR THE ACQUISITION OF ELECTRIC SIGNALS IN COMPLIANCE WITH THE ARNIC 429 STANDARD

BACKGROUND OF THE INVENTION

1. Field of the Invention

This invention relates to a device for the acquisition and analog-to-digital conversion of electric signals requiring analog formatting, notably to minimize or even suppress the effects of radioelectric interference.

It applies notably, though not exclusively, to the transmission of digital data in compliance with the ARINC 429 standard used on board aerodynes.

2. Description of the Prior Art

The ARINC 429 standard defines a protocol for digital data transmission via a wire link comprising a pair of stranded and screened wires. It is mainly applied to data transmissions between the various items of electronic equipment taken on board aerodynes, these transmissions being performed by differential voltage modulation between a single transmitter and plural addressees.

According to this standard, a digital datum is transmitted at a speed of 12.5 or 100 kilobits per second by means of two analog signals H and L respectively applied to the two wires of the link, these two signals being symmetrical in relation to a reference voltage in the vicinity of zero volts. A bit at "1" is represented by the signal H by a trapezium having a constant voltage range in the vicinity of a maximum voltage of +10 volts, followed by a voltage range in the vicinity of the reference voltage. Similarly, a bit at "0" is represented by a trapezium having a constant voltage range in the vicinity of a minimum voltage of −10 volts, followed by a voltage range in the vicinity of the reference voltage.

To ensure reception of such signals, the maximum, minimum and reference voltage levels are detected in order to generate two logic signals respectively corresponding to the signals H and L received at input. At present, analog threshold comparators are used to detect the different levels.

However, we have experienced a spectacular miniaturization of electronic devices, and notably of those used in avionics, through the application of digital electronics techniques. On the other hand, this phenomenon has not been as significant in the case of analog electronics.

It so happens that ARINC 429 data receiving circuits are difficult to integrate into low-cost components of small dimensions.

Moreover, since an ARINC 429 transmission line can only comprise one single transmitter, certain flight control devices comprise several tens of acquisition channels for ARINC 429 signals. It ensues that these devices are very costly and have space requirements that are difficult to reduce with digital electronics technology.

To solve this problem, attempts have been made to group the input channels together by means of multiplexing technology. Experience has shown that, with this solution, a multiplexed input channel can be "dazzled" by a source completely occupying the channel and, as a result, preventing the other sources from transmitting. This solution is therefore not very compatible with the safety and reliability requirements in force in aviation.

Furthermore, there are integration techniques for analog circuits such as the solid-state or hybrid techniques. However, the solid-state and hybrid integrated circuits, which must be active in order to serve as threshold comparators, remain costly and only enable a relatively low level of integration to be achieved by comparison with digital components. In addition, these components are not widely used and the durability thereof is therefore far from ensured.

OBJECT OF THE INVENTION

The main object of this invention is to remedy the preceding disadvantages, particularly to provide a device for converting an analog signal of digital data transmission into a digital signal, comprising an analog circuit to which the received analog signal is applied, and which is connected to the input of a digital circuit capable of supplying said digital signal.

SUMMARY OF THE INVENTION

This device is characterized in that the analog circuit comprises a capacitor which is charged by the received analog signal via a first resistor, the voltage at the terminals of the capacitor being applied to the input of the digital circuit via a second resistor, said digital circuit comprising:

a measuring and compensating circuit including a digital threshold comparator for comparing the voltage at the capacitor terminals with a threshold, and for transmitting, to a flip-flop, a logic signal whose status is a function of the result of the comparison, a means for periodically applying, via the second resistor, to the terminals of the capacitor, a charge or discharge compensation voltage depending on the status of the flip-flop, during a first constant period having a predetermined value, so as to charge or discharge the capacitor and bring the latter's voltage back to the threshold voltage, a filtering and counting circuit comprising a means for counting, by way of the picture signal of the flip-flop status, among the last N compensations applied to the capacitor, the number of discharge compensations from which is deducted the number of charge compensations, the number thus obtained being at all times representative of the received analog signal.

By way of these arrangements, the analog circuit is only comprised of resistors and capacitors. It is therefore purely passive and can thus be integrated into a very inexpensive hybrid type passive component of small dimensions such as a DIL network. Moreover, given the simplicity of the analog circuit, the durability of such hybrid circuits is ensured.

Furthermore, due to the processing performed on the signal upstream of the threshold comparator, there is no need to use a high-precision comparator, thus enabling the analog comparators normally used to be replaced by a single digital comparator, the filtering and counting circuit avoiding having to take into account any threshold drifts that might occur.

Devices thus obtained are perfectly suited to the reception of analog signals of digital data transmission.

Advantageously, the output terminals of the analog circuit are disposed so as to achieve a maximum reduction of the length of the links between the analog and digital circuits. In this way, the value of the stray capacities caused by the connections and links is reduced to a minimum.

According to one feature of the invention, the device enables the acquisition of differential-mode signals respectively transmitted by two differential channels. For this purpose, it comprises:

an analog circuit comprising two channels each comprising the capacitor and the first and second resistors to which the two differential-mode signals are respectively applied, and two circuits identical to said digital circuit respectively connected to the outputs of the analog circuit channels, digital comparators capable of detecting different voltage levels by means of the digital values representative of the input differential-mode analog signals, and a logic circuit designed to generate a logic signal representative of the input signal from the signals coming from said digital comparators.

Advantageously, the differential-mode signal acquisition device comprises a single filtering and counting circuit connected to the two measuring and compensating circuits via an interfacing circuit with the following function:

if the outputs of the measuring and compensating circuits are identical at a given moment, the interfacing circuit applies, to the filtering and counting circuit, a value arbitrarily and alternately set at the two voltage compensation values, and if the outputs of the measuring and compensating circuits have opposite values, the interfacing circuit applies, to the filtering and counting circuit, the compensation value applied to one of the two differential channels.

BRIEF DESCRIPTION OF THE DRAWINGS

Further features and advantages of the invention will be apparent from an embodiment of the device according to the invention described, by way of a non-limiting example, in reference to the corresponding accompanying drawings in which:

FIG. 1 schematically represents the device embodying the invention;

FIG. 2 illustrates, in the form of a set of time charts, the operating principle of the device embodying the invention;

FIG. 3 schematically represents a digital decimating circuit adapted for the acquisition of the signal at output of the circuit represented in FIG. 1;

FIG. 4 shows a device adapted for the acquisition of a signal transmitted in the form of a differential pair, such as an ARINC 429 signal;

DESCRIPTION OF THE PREFERRED EMBODIMENTS

Figure 5:
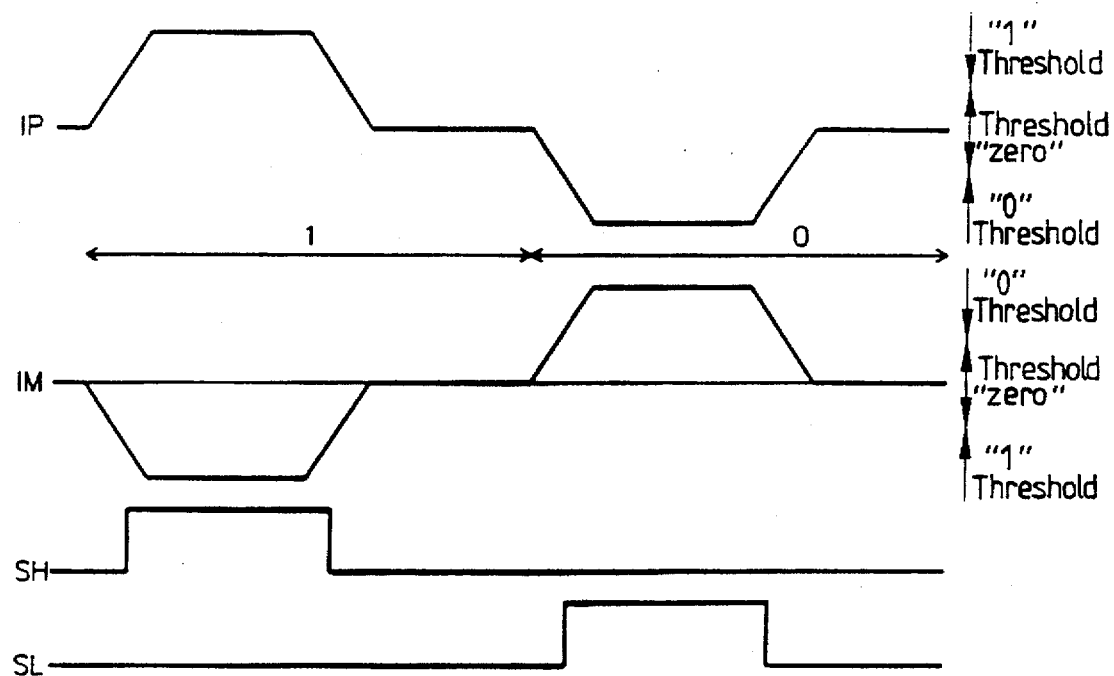
FIG. 5 shows the shape of an ARINC 429 signal, and the shape of the signals obtained at output of the device represented in FIG. 4.

The device represented in FIG. 1 comprises an analog circuit CA connected to a digital circuit CN1. The analog circuit CA is constituted by a bridge with a connection point A to which the following are connected:

a resistor R1 via which the signal to be processed E transits, a capacitor C connected to the ground, and a resistor R2 via which passes the analog circuit CA output signal which is applied to the input terminal B of the digital circuit CN1.

The digital circuit CN1 comprises a threshold comparator of which the input is connected to the input terminal B and to the output of a buffer memory 12. This circuit also includes a flip-flop D 13 comprising an input d to which the signal supplied by the threshold comparator 11 is applied. The signal emitted at the output q of the flip-flop 13 is transmitted to the output S1 of the digital circuit CN1, whereas the inverted output nq of the flip-flop 13 is connected to the input of the buffer memory 12.

The digital circuit CN1 is timed by a phase generator 14 designed to supply two synchronous square pulses Ckm and En as a function of a clock signal H applied to the input of the generator 14, the signal Ckm being applied to the input of the clock signal of the flip-flop D 13, and the signal En is applied to the buffer memory 12 in order to control the blocked or unblocked status thereof and to thus validate or invalidate the output.

Furthermore, the digital circuit CN1 is built with CMOS technology so as to present a high input impedance when the buffer memory 12 is in the blocked state, and to act as a voltage source when the latter is in the unblocked state.

Thus, in FIG. 2 which shows the timing charts of the signals in transit at various points of the circuit in FIG. 1, the signals Ckm and En have a frequency equal to half that of the clock signal H, the signal En having falling edges in phase with those of the signal Ckm, and rising edges delayed by a quarter-period in relation to those of the signal Ckm.

FIG. 2 also shows the shape of the signals at the input B and output S1 of the digital circuit CN1, and at the input d of the flip-flop D 13, as a function of a signal E applied at input of the analog circuit CA.

The timing chart of the signal at B shows a succession of two phases working into each other indefinitely at a fixed rate, i.e.

a measuring phase during which the input B of the digital circuit has high impedance, the buffer memory 12 being in the blocked state, and during which the comparator 11 determines whether the voltage at the terminals of the capacitor C is below or above the threshold, e.g. equal to +2.5 volts, the result of the comparison being stored in the flip-flop D 13, and a compensating phase that can be broken down into two sub-phases of theoretically close duration; the first sub-phase corresponding to the inactive part of the compensation during which the flip-flop can be in a metastable state before stabilizing itself to apply a signal to its direct q and inverted nq outputs, the signal at the output nq being applied to the buffer memory 12 which still has high impedance; during the second sub-phase, known as the active compensation sub-phase, the buffer memory 12 is unblocked by means of the signal En which moves to the logic "1" level (e.g. +5 volts) to present a low impedance, and contribute to bringing the voltage at the terminals of the capacitor to the opposite value of the previous reading in relation to the threshold.

The shape of the signal d shown in this figure is obtained by means of the comparator 11 which supplies a signal at 0 volts during the periods when the signal at B is below the threshold, and a signal e.g. at +5 volts during the periods when the voltage at B is above the threshold.

The value of the signal at the output q (=S1) of the flip-flop D 13 is updated, at each rising edge of the signal Ckm, to the value of the signal at input d, and the buffer memory 12 receives a 0-volt charge if the signal at the output S1 corresponds to 5 volts and, conversely, receives a 5-volt charge if the signal at the output S1 corresponds to 0 volts.

In this way, the signal at B is compelled to remain in the vicinity of the threshold voltage, the signal at the output S1 being representative of the compensations made in one or other direction and applied to the capacitor C.

If, thereafter, the signal S1 is used to accumulate compensations over a fixed duration corresponding to N measurement periods, it is possible to evaluate the value of the input voltage which also contributes to changing the voltage at the terminals of the capacitor C via the resistor R1. An analog-to-digital converter is thus obtained whose precision depends on the measurement accumulation period, the sampling frequency (Ckm) and, of course, the limitations imposed by the analog characteristics of the components used by the device embodying the invention. Experience has shown that the precision thus obtained is amply sufficient for the acquisition of ARINC 429 signals.

It should be noted that a single connection pin B is used between the analog circuit CA and the digital circuit CN1, this pin being used both in the measurement function and in the compensation function which are performed exclusively at different moments in time. This temporal separation of the measurement and compensation functions is obtained by means of the shape of the signals Ckm and En, and by the synchronism thereof.

FIG. 3 shows a digital filtering and decimating circuit CN2 enabling accumulation of the compensations provided by the output S1 of the circuit CN1 over a predetermined period. This circuit CN2 comprises a shift register constituted by N flip-flops D 21 to D 24 mounted in series and timed by the same signal Ckm, the input d of the first flip-flop D 21 constituting the input E1 of this circuit CN2 and being connected to the output S1 of the circuit CN1.

This circuit CN2 also comprises a reversible counter 25 which updates a synopsis of the values entering and leaving the shift register, in order to keep at all times the number of bits at "1" present in the shift register to within an initializing constant, this number being representative of the average voltage of the analog signal applied to the input E over a period corresponding to the N previous measurements, N being the number of flip-flops 21 to 24 in the shift register.

When the circuit CN2 is initialized, a RESET signal is applied to the flip-flops D 21 to 24 of the shift register, alternately either to the input setting to "0" or to the input setting to "1", so as to initialize the register at an average value, e.g. 0 1 . . . 0 1. This average value, which corresponds to the initialization value, is also applied to the reversible counter 25.

At each rising edge of the signal Ckm, the compensation value coming from the circuit CN1 is loaded into the first flip-flop 21, while the previous values are transmitted step-by-step into the next flip-flops D 22 to 24 by the non-inverted outputs q, the value at the non-inverted output q of the last flip-flop D 24 being applied to the input of an XOR gate 26 whose other input is connected to the input E1 of the circuit CN2. The reversible counter 25 further comprises:

- an input Up connected to the input E1 of the circuit CN2, and on which is presented the value to be counted,
- an input En connected to the output of the XOR gate 26 enabling the counting of the value applied to the input Up to be triggered, and
- a parallel output connected to the output S2 of the circuit CN2, to which the reversible counter 25 value is applied.

Thus, if the signal at the input E1 is at the logic "0" level, the value of the reversible counter remains unchanged. Conversely, if the signal at the input E1 is at the logic "1" level, the value of the reversible counter 25 is incremented provided the signal at the output of the shift register is at logic "0".

Likewise, the reversible counter 25 is only decremented if the signal at the input E1 is at "0" and the output of the shift register is at "1".

Thus, the reversible counter 25 is only incremented if a "1" value replaces a "0" value in the shift register, and is only decremented if a "0" value replaces a "1" value in the shift register.

The principle of the device described above can advantageously be applied to the acquisition of ARINC 429 signals of the shape illustrated in FIG. 5.

An ARINC 429 signal comprises in fact two differential signals IP and IM, one being at all times symmetrical to the other in relation to a reference voltage in the vicinity of zero. According to the ARINC 429 standard, a binary datum at "1" is represented in the positive channel IP by a trapezoidal signal having a constant positive voltage range of the order of +10 volts, followed by a signal of constant voltage in the vicinity of the reference voltage, whereas a binary datum at "0" is represented by a phase of constant voltage in the vicinity of −10 volts followed by a signal of voltage in the vicinity of the reference voltage.

To acquire such a signal, the device represented in FIG. 4 comprises two input channels, i.e. a positive channel IP and a negative channel IM corresponding to the ARINC 429 signal transmitted in the differential mode along the two serial lines. These two inputs are applied to an analog circuit CA2 comprising, for each of the inputs, a bridge comprising the resistors R1 and R2 and the capacitor C, as described above.

This device also comprises a digital circuit CN comprising two circuits 31, 32 of the type of the circuit CN1 described above and represented in FIG. 1, the inputs B of these two circuits being connected to the outputs of the analog circuit CA2.

Advantageously, this device only comprises one filtering and decimating circuit CN2 for two analog acquisition channels. To this end, it comprises a digital circuit CN3 comprising one XOR gate 36 of which the inputs are connected to the outputs of the circuits CN1 31 and 32. This circuit CN3 also comprises two selectors 34, 35 each comprising a selection input connected to the output of the XOR gate 36, two inputs respectively referenced 0 and 1, and an output which supplies the input signal 0 or 1 selected as a function of the logic level of "0" or "1" respectively of the selection signal applied to the selection input.

The input 1 of the first selector 34 is connected to the output q of a flip-flop D 33, whereas the input 0 of this selector is connected to the inverted output nq of the flip-flop 33 and to the input 0 of the other selector 35. The output of the first selector 34 is connected to the input d of the flip-flop 33, the latter being timed by the signal Ckm generated by a phase generator such as the one referenced 14 in FIG. 1. The output S1 of the first circuit CN1 31 is further applied to the input 1 of the second selector 35 whose output is applied to the input E1 of the circuit CN2.

The circuit CN3 thus performs the following function:

if the outputs of the circuits CN1 are identical, i.e. if the compensations applied to the two inputs IP and IM are identical at a given moment, a value arbitrarily and alternately determined at the two possible compensation values, namely 0 and +5 volts, is inserted into the shift register of the circuit CN2, and if the compensations applied to the inputs IP and IM are of opposite values, the compensation value applied to the positive channel IP is inserted into the shift register of the circuit CN2.

In the device represented in FIG. 4, the parallel 0 output S2 of the circuit CN2 is applied to four digital threshold comparators 37 to 40, so as to be able to detect the exceeding of four thresholds represented in FIG. 5, i.e. if the digital values transmitted by the circuit CN2 are:

above the threshold of the logic "1" level of the ARINC 429 signal, below the threshold of the logic "0" level, below the threshold of the reference level (in the vicinity of 0 volts) subsequent to a detection of level "1", or above the reference level threshold subsequent to a detection of level "0".

The respective outputs of the threshold comparators 37 to 40 are applied to the input of a logic circuit 41 which is designed to generate two logic signals SH and SL shown in FIG. 5, the signal SH containing a pulse to represent each binary datum at "1" and the signal SL containing a pulse to represent each binary datum at "0" contained in the signals IP and IM applied at input.

Furthermore, the logic circuit 41 comprises a zero threshold detection output indicating whether the reference threshold subsequent to a "1" or a "0" has been exceeded, this output being connected to the input of an OR gate 42 to which the RESET signal is also applied. Thus, the flip-flop D 33 and the circuit CN2, i.e. the shift register 21 to 24 and the reversible counter 25, are reset to an average value every time the reference level has been detected in the input signals IP and IM.

For instance, for the acquisition of ARINC 429 signals, the resistor R1 is at 12 kΩ, the resistor R2 is at 600Ω, and the capacitor C is at 1.2 nF. As an ARINC signal is transmitted at a speed of 12.5 or 100 kilobits/second, a 20 MHz clock H is used to obtain an oversampling of the input signal.

In the diagram in FIG. 4, the analog part is highly reduced and can be easily integrated into a hybrid circuit of the DIL network type. Moreover, the analog part only includes standard functions which can therefore be easily integrated into an integrated digital circuit. It is desirable to arrange the connection pins B of the digital circuit CN opposite the connection pins of the analog circuit so as to do away with the links between these two circuits and thus achieve maximum reduction of the stray capacities resulting from these links.

To manufacture a device enabling simultaneous acquisition of several ARINC 429 channels, a single phase generator can be used for all the channels, provided the measurement and compensation phases are timed in opposite phase for two-channel groups so as to spread over time the surges of current supplied by the power supply to the circuit, and to thereby minimize the amplitude.

We claim:

1. A device for converting an analog signal of digital data transmission into a digital signal, comprising an analog circuit to which is applied the analog signal, and which is connected to an input of a digital circuit for supplying said digital signal, said analog circuit comprising a capacitor which is charged by said received analog signal via a first resistor, the voltage at the terminals of the capacitor being applied to a terminal connecting said analog circuit to a digital circuit via a second resistor, said digital circuit comprising:

a measuring and compensating circuit including a digital threshold comparator for comparing the voltage at said capacitor terminals with a threshold voltage, and for transmitting, to a flip-flop, a logic signal whose status is a function of the result of said comparison, a means for periodically applying, via said second resistor, to said capacitor, a charge or discharge compensation voltage depending on the status of said flip-flop, during a first constant period having a predetermined value, so as to charge or discharge said capacitor and bring the voltage of said capacitor back to said threshold voltage, and a filtering and counting circuit comprising a means for counting, by way of an output signal of said flip-flop representative of the flip-flop status, among last N compensations applied to said capacitor, the number of discharge compensations from which is deducted the number of charge compensations, the number thus obtained being at all times representative of said received analog signal.

2. The device as claimed in claim 1, wherein the input terminal of said digital circuit is disposed so as to achieve maximum reduction of the length of the links between said analog and digital circuits.

3. The device as claimed in claim 1, wherein said analog circuit only comprises passive components.

4. The device as claimed in claim 1, wherein the compensation voltages are applied by the digital circuit to the terminal connecting the analog circuit to the digital circuit.

5. The device as claimed in claim 1, wherein the measuring and compensating circuit comprises a buffer memory having an output connected to the terminal connecting the analog circuit to the digital circuit, and a flip-flop having an input connected to the output of the digital comparator, an inverted output connected to an input of the buffer memory, and a non-inverted output which constitutes an output of said measuring and compensating circuit, the flip-flop being timed by a clock signal in synchronism with a signal unblocking said buffer memory.

6. The device as claimed in claim 5, wherein the signal unblocking the buffer memory has rising edges offset by one quarter of a period in relation to the rising edges of the clock signal, and falling edges in phase with those of said clock signal.

7. The device as claimed in claim 1, wherein the filtering and counting circuit comprises a shift register initialized at an average value, and a reversible counter initialized at said average value, the shift register being periodically loaded with the values of the compensation voltages applied to the capacitor, the reversible counter being incremented if a positive voltage compensation value replaces a zero voltage compensation value in the shift register, and decremented if a zero voltage compensation value replaces a positive voltage compensation value in said shift register, so that the digital value of said reversible counter reflects at all times, to within one constant, the value stored in said shift register.

8. The device as claimed in claim 7, wherein the number N of compensations on which a counting is performed corresponds to the dimension of the shift register.

9. The device as claimed in claim 7, wherein the filtering and counting circuit comprises an XOR gate having one input connected to the output of the shift register, and an output connected to an input triggering a counting by the reversible counter, the voltage compensation values coming from the measuring and compensating circuit being applied to the input of said shift register, to the input of the reversible counter and to the input of the XOR gate, the reversible counter supplying digital values representative of the average of the analog signal applied to the input of the analog circuit.

10. A device for the acquisition of two differential-mode analog signals respectively transmitted by two differential channels, said device comprising:

an analog circuit comprising two channels in which the two differential-mode signals are respectively applied, each of said channels comprising a capacitor which is charged by the corresponding differential-mode analog signal via a first resistor, the voltage at the terminals of the capacitor being applied to an input of a respective digital circuit via a second resistor, each of said digital circuits supplying at all times a digital value representative of said analog signal applied to the corresponding channel of said analog circuit, by means of: (i) a measuring and compensating circuit including a digital threshold comparator for comparing the voltage at the capacitor terminals of the corresponding channel with a threshold voltage, and for transmitting to a flip-flop, a logic signal having a status which is a function of the result of said comparison, a means for periodically applying, via said second resistor, to said capacitor, a charge or discharge compensation voltage depending on the status of said flip-flop, during a first constant period having a predetermined value, so as to charge or discharge said capacitor and bring the voltage of said capacitor back to said threshold voltage, and (ii) a filtering and counting circuit comprising a means for counting, by way of an output signal of said flip-flop representative of the flip-flop status, among last N compensations applied to said capacitor, the number of discharge compensations from which is deducted the number of charge compensations, the number thus obtained being at all times representative of said received analog signal, digital comparators for detecting different voltage levels by means of the digital values representative of the input differential-mode analog signals, and a logic circuit designed to generate two logic signals representative of the input analog signals, from the signals coming from said digital comparators.

11. The device as claimed in claim 10, further comprising a single filtering and counting circuit connected to the two measuring and compensating circuits via an interfacing circuit having the following function:

if the outputs of said measuring and compensating circuits are identical at a given moment, the interfacing circuit applies, to said filtering and counting circuit, a value arbitrarily and alternately set at the two voltage compensation values, and if the outputs of the measuring and compensating circuits have opposite values, said interfacing circuit applies, to said filtering and counting circuit, the compensation value applied to one of said two differential channels.

12. The device as claimed in claim 10, wherein the logic circuit transmits a retiming signal intended to reset the shift register and the reversible counter at said average value, when it detects that the input signal has a voltage in the vicinity of the reference voltage.

13. The device as claimed in claim 10, said device comprising plural differential-mode signal acquisition chains, each chain receiving at input two differential-mode analog signals and issuing at output two logic signals representative of the input analog signals, said device further comprising a single phase generator capable of supplying two pairs of clock signals and buffer memory unblocking signals in opposite phase, each of said two pairs being used for the timing of a respective half of said acquisition chains.

* * * * *